(12) United States Patent
Winn

(10) Patent No.: US 10,790,403 B1
(45) Date of Patent: Sep. 29, 2020

(54) MICROFABRICATED VACUUM PHOTODIODE ARRAYS FOR SOLAR POWER

(71) Applicant: nVizix LLC, Stamford, CT (US)

(72) Inventor: David Roberts Winn, Westport, CT (US)

(73) Assignee: nVizix LLC, Stamford ( * ) Notice: Subject to any disclaimer, the term of this patent is extended or adjusted under 35 U.S.C. 154(b) by 1635 days.

(21) Appl. No.: 14/205,564

(22) Filed: Mar. 12, 2014

Related U.S. Application Data

(60) Provisional application No. 61/784,307, filed on Mar. 14, 2013.

(51) Int. Cl.
| | | |
|---|---|---|
| *H01L 31/00* | (2006.01) | |
| *H01L 31/048* | (2014.01) | |
| *H01L 31/0232* | (2014.01) | |

(52) U.S. Cl.
CPC ...... *H01L 31/048* (2013.01); *H01L 31/02327* (2013.01)

(58) Field of Classification Search
CPC .................. H01L 31/048; H01L 31/02327
USPC ................................................. 136/243–293
See application file for complete search history.

(56) References Cited

U.S. PATENT DOCUMENTS

| | | |
|---|---|---|
| 326,310 A | 9/1885 | Martin |
| 3,001,100 A | 9/1961 | Schuh et al. |
| 3,263,101 A | 7/1966 | Willard et al. |
| 3,312,840 A * | 4/1967 | Gabor ............... G21H 1/106 310/306 |
| 3,958,143 A * | 5/1976 | Bell ................... H01J 1/34 257/13 |
| 4,094,703 A | 6/1978 | Williams |

(Continued)

FOREIGN PATENT DOCUMENTS

JP           01-196539       *   8/1989 ............. G01N 21/35

OTHER PUBLICATIONS

Smestad, Greg P. "Conversion of heat and light simultaneously using a vacuum photodiode and the thermionic and photoelectric effects." Solar Energy Materials and Solar Cells 82.1 (2004): 227-240.

(Continued)

*Primary Examiner* — Thanh Truc Trinh
(74) *Attorney, Agent, or Firm* — Hoffberg & Associates; Steven M. Hoffberg

(57) ABSTRACT

A system and method are presented for the design and fabrication of arrays of vacuum photodiodes for application to solar power generation. In a preferred embodiment, each photodiode cell comprises a microfabricated enclosure with a hermetically sealed vacuum, an absorptive photocathode, and a transparent anode, wherein the photocathode and the anode are separated by a vacuum gap of less than about 20 micrometers. Light incident on the photocathode through the anode leads to a flux of electrons passing from the photocathode across the vacuum gap to the anode. In a further preferred embodiment, the photocathode is backed by a reflection layer with, e.g., controlled diffuse reflection, thus increasing the efficiency of energy extraction. An array of such cells may be manufactured using automated thin-film deposition and micromachining techniques.

21 Claims, 5 Drawing Sheets

(56) References Cited

U.S. PATENT DOCUMENTS

| | | | |
|---|---|---|---|
| 4,453,108 A * | 6/1984 | Freeman, Jr. | H01J 25/30 315/4 |
| 5,028,835 A | 7/1991 | Fitzpatrick | |
| 5,601,966 A | 2/1997 | Kumar et al. | |
| 5,973,259 A | 10/1999 | Edelson | |
| 6,509,669 B1 | 1/2003 | King et al. | |
| 6,835,922 B1 | 12/2004 | Shimoi et al. | |
| 6,853,127 B1 | 2/2005 | Eccleston et al. | |
| 7,589,348 B2 | 9/2009 | Walitzki | |
| 7,736,946 B2 | 6/2010 | Seppala et al. | |
| 8,143,566 B2 | 3/2012 | Levy | |
| 2003/0184188 A1 | 10/2003 | Kucherov et al. | |
| 2003/0192582 A1 | 10/2003 | Guevara | |
| 2004/0189141 A1 | 9/2004 | Tavkhelidze et al. | |
| 2005/0275330 A1 | 12/2005 | Sung | |
| 2006/0124958 A1 | 6/2006 | Cox et al. | |
| 2006/0137737 A1 | 6/2006 | Nakayama et al. | |
| 2006/0138896 A1 | 6/2006 | Makansi | |
| 2007/0006583 A1 | 1/2007 | Veneruso | |
| 2007/0024154 A1 | 2/2007 | Kucherov et al. | |
| 2007/0024180 A1 | 2/2007 | Choi et al. | |
| 2007/0126312 A1 | 6/2007 | Sung | |
| 2007/0166916 A1 | 7/2007 | Solomon et al. | |
| 2008/0174225 A1 | 7/2008 | Tessner et al. | |
| 2008/0197747 A1 | 8/2008 | Rasor et al. | |
| 2008/0203885 A1 | 8/2008 | Ono et al. | |
| 2009/0078872 A1 | 3/2009 | Korsah et al. | |
| 2009/0079297 A1 | 3/2009 | Walitzki | |
| 2009/0098671 A1 | 4/2009 | Kim et al. | |
| 2009/0101136 A1 | 4/2009 | Rabinowitz | |
| 2009/0107535 A1 | 4/2009 | Hu | |
| 2009/0127549 A1 | 5/2009 | Walitzki | |
| 2009/0130016 A1 | 5/2009 | Mills | |
| 2009/0139244 A1 | 6/2009 | Ullo et al. | |
| 2009/0158750 A1 | 6/2009 | Rubin | |
| 2009/0167138 A1 | 7/2009 | Liu et al. | |
| 2009/0170394 A1 | 7/2009 | Liu et al. | |
| 2009/0205695 A1 | 8/2009 | Makansi | |
| 2009/0223548 A1 | 9/2009 | Walitzki | |
| 2009/0229648 A1 | 9/2009 | Makansi | |
| 2009/0256135 A1 | 10/2009 | Xiao et al. | |
| 2009/0284124 A1 | 11/2009 | Kutschera et al. | |
| 2009/0315444 A1 | 12/2009 | Chen et al. | |
| 2009/0322221 A1 | 12/2009 | Makansi | |
| 2010/0018843 A1 | 1/2010 | Aimi et al. | |
| 2010/0026160 A1 | 2/2010 | Terui et al. | |
| 2010/0028235 A1 | 2/2010 | Qin et al. | |
| 2010/0055885 A1 | 3/2010 | Robinson et al. | |
| 2010/0072461 A1 | 3/2010 | Hannebauer | |
| 2010/0090581 A1 | 4/2010 | Terui et al. | |
| 2010/0139771 A1 | 6/2010 | Schwede et al. | |
| 2011/0017253 A1 | 1/2011 | Kataoka et al. | |
| 2011/0023941 A1 | 2/2011 | DiDomenico | |
| 2011/0084591 A1 | 4/2011 | Chen et al. | |
| 2011/0100430 A1 | 5/2011 | Zak, Jr. et al. | |
| 2011/0139205 A1 | 6/2011 | Kimura et al. | |
| 2011/0148248 A1 | 6/2011 | Landa | |
| 2011/0221328 A1 | 9/2011 | Nemanich et al. | |
| 2011/0226299 A1 | 9/2011 | Makansi | |
| 2011/0303214 A1 | 12/2011 | Welle | |
| 2012/0060882 A1 | 3/2012 | Makansi | |
| 2012/0146455 A1 | 6/2012 | Makansi | |
| 2012/0299438 A1 | 11/2012 | Kimura et al. | |

OTHER PUBLICATIONS

Richardson, Owen, "Thermionic phenomena and the laws which govern them", Nobel Lecture, Dec. 12, 1929.
Anisimov, S. I., B. L. Kapeliovich, and T. L. Perelman. "Electron emission from metal surfaces exposed to ultrashort laser pulses." Zh. Eksp. Teor. Fiz 66.2 (1974): 375-377.
Lin, Yow-Jon. "Application of the thermionic field emission model in the study of a Schottky barrier of Ni on p-GaN from current-voltage measurements." Applied Physics Letters 86.12 (2005): 122109-122109.
Fowler, Ralph Howard, and L. Nordheim. "Electron emission in intense electric fields." Proceedings of the Royal Society of London A: Mathematical, Physical and Engineering Sciences. vol. 119. No. 781. The Royal Society, 1928.
Vashaee, Daryoosh, and Ali Shakouri. "Improved thermoelectric power factor in metal-based superlattices." physical review letters 92.10 (2004): 106103-106103.
Vearey-Roberts, A. R., and D. A. Evans. "Modification of GaAs Schottky diodes by thin organic interlayers." Applied Physics Letters 86.7 (2005): 72105-72105.
Ishibashi, T., et al. "Uni-traveling-carrier photodiodes." Tech. Dig. Ultrafast Electronics and Optoelectronics 13 (1997): 83-87.
Lee, J. H., et al. "Thermionic emission from microfabricated silicon-carbide filaments." Technical Digest Power MEMS (2009): 6-9.
Sarrazin, P., et al. "Carbon-nanotube field emission X-ray tube for space exploration XRD/XRF instrument." Adv X Ray Anal 47.8 (2004).
Viswanathana, C., et al. "Current-Voltage Studies on Vacuum Evaporated In70Se30 Thin Films." Journal of Optoelectronics and Advanced Materials 7.2 (2005): 713-720.
Babkair, Saeed Salem. "Charge transport mechanisms and device parameters of CdS/CdTe solar cells fabricated by thermal evaporation." Saudi Arabia: King abdulaziz Unl-Versity. JKAU: Sci 22.1 (2010): 21-33.
Lux-Steiner, M. Ch. "Non-conventional semiconductor materials for solar cells." Springer Proceedings in Physics 54 (1991): 420-431.
Chu, Chih Wei, et al. "Organic donor-acceptor system exhibiting electrical bistability for use in memory devices." Advanced Materials 17.11 (2005): 1440-1444.
Saikia, R., Hitur A. J., P. K. Kalita, and P. Datta. "Green synthesized CdS nanorods for application in Schottky type solar cell." International Journal of Chemical Science and Technology 2.2 (2012): 23-28.
Belfar, Abbas, and Rachida Mostefaoui. "Simulation of n1-p2 microcrystalline silicon tunnel junction with AMPS-1D in a-Si: H/uc-Si: H Tandem Solar Cells." Journal of Applied Sciences 11.16 (2011): 2932-2939.
Alfaramawi, K. "Estimation of the ideality factor of ZnTe/CdTe pp heterojunction diodes." Optoelectronics and Advanced Materials-Rapid Communications 2.12 (2008): 763-765.
Moghaddam, Mehran Vandani, et al. "Photon-Impenetrable, Electron-Permeable: The Carbon Nanotube Forest as a Medium for Multiphoton Thermal-Photoemission." ACS Nano 9.4 (2015): 4064-4069.
Sung, James C., and Ming-Chi Kan. "Cold cathode fluorescence light with amorphous diamond coated electrodes." Nano Science and Technology Institute-Nanotech 1 (2006): 239-243.
El Tayyan, Ahmed A. "Estimation of the local ideality factor of CdS/Cu (In, Ga) Se2 Interface from experimental data." European International Journal of Science and Technology 4.
Jeetendra, Shailaja, et al. "Optimization of thickness of Sb2Te3 thin film as back contact for CdTe thin film solar cells." Adv. Mat. Lett 5 (2014): 2014.
Huang, Jinsong, Zheng Xu, and Yang Yang. "Low-work-function surface formed by solution-processed and thermally deposited nanoscale layers of cesium carbonate." Advanced Functional Materials 17.12 (2007): 1966.
Chesta, E., et al. "Experimental Studies Related to Field Emission Thruster Operation: Emission Impact on Solar Cell Performances and Neutralization Electron Backstreaming Phenomena." IEPC-2003-102, Proceedings of the International Electric Propulsion Conference, Toulouse, France, 2003.
Paganucci, F., P. Rossetti, and M. Andrenucci. "Temperature Effects on Current Emission in an artificially Heated MPD cathode." 25th International Electric Propulsion Conference. 1997.
Rakhshani, A. E., et al. "Charge transport mechanisms in Au—CdTe space-charge-limited Schottky diodes." physica status solidi(a) 168.1 (1998): 177-187.

(56) References Cited

OTHER PUBLICATIONS

Ohkawa, Yasushi, et al. "A Carbon Nanotube Field Emission Cathode for Electrodynamic Tether Systems." 32nd International Electric Propulsion Conference. 2011.

Luke, Keung P., and John R. Smith. Theoretical Study of Zero-Field Electron Work Function of Metal Immersed in Gas-Direct Application to Cesium Thermionic Diode. vol. 2357. National Aeronautics and Space Administration, 1964.

Gloeckler, Markus. Device physics of Cu (In, Ga) Se2 thin-film solar cells. Diss. Colorado State University, 2005.

Qi, Xiangfei, Ning Li, and Stephen R. Forrest. "Analysis of metal-oxide-based charge generation layers used in stacked organic light-emitting diodes." Journal of Applied Physics 107.1 (2010): 014514.

Hałas, Stanisław. "100 years of work function." Materials Science—Poland 24.4 (2006).

Fisher, J., T. Srinivasan-Rao, and T. Tsang. "UV Photoemission from Metal Cathodes for Picosecond Power Switches,." Proceedings of the Switched Power Workshop (Shelter Island. 1988).

Yamamoto, Kentaro, Shinichi Tashiro, and Manabu Tanaka. "Numerical analysis of current attachment at thermionic cathode for gas tungsten arc at atmospheric pressure." Transactions of JWRI 38.1 (2009): 1-5.

Chou, Sharon H. Discovering Low Work Function Materials for Thermionic Energy Conversion. Diss. Stanford University, 2014.

Raja, W., et al. "Photon-Enhanced Thermionic Emission." European Space Agency (ESA) (2015).

Kreh, Bret B., "Analysis of Instability Growth and Collisionless Relaxation in Thermionic Converters Using 1-D PIC Simulations", M.S. Thesis, Air Force Institute of Technology 1994.

Benilov, Mikhail S. "The High-Current-Density Phase of the Discharge in Low-Pressure High-Power Switches as a Mode of the Vacuum Discharge." IEEE Trans on Plasma Science 20(6) 1047-1052 (1992).

Buencuerpo, J., et al. "Photon-Enhanced Thermionic Emission." Final Report, European Space Agency (ESA) (2015).

Nottingham, W.B., "The Thermionic Energy Converter", MIT Research Laboratory of Electronics TR 373 (Sep. 9, 1960).

Nottingham, W.B., "Thermionic Emission", MIT Research Laboratory of Electronics TR 321 (Dec. 10, 1956).

Gyftopoulos, Elias P., et al., "Thermionic Nuclear Reactors", Electrical Engineering, pp. 108-116, Feb. 1963.

Paxton IV, William Francis, "Characterization of the Thermal Electron Emission Properties of Boron-Doped Polycrystalline Diamond Films for Use in Energy Conversion", M.S. Thsis, Vanderbilt University, May 2011.

Nottingham, Wayn B., et al., "Theoretical Background for Thermionic Conversion Including Space-Charge Theory, Schottky Theory, and the Isothermal Diode Sheath Theory ", NASA Technical Note TN D-3324, Mar. 1966.

Lovicott, Dominick, "Electron Emission Thermal Energy Conversion", M.S. Thesis, U. Missouri, Jul. 2010.

Cho, Mengu, "Plasma surface interaction Various Discharges", La Seine lecture notes.

Lin, T. P., and Genghmun Eng. "Thermionic emission including both space-charge and image forces" Journal of applied physics 65.8 (1989): 3205-3211.

Yi, Pei, and Zhang Geng-Min. "Simulation of space charge effect in field emission from a nanowire." Chinese Physics Letters 22.3 (2005): 648.

Gonçalves, J. A. N., J. J. Barroso, and G. M. Sandonato. "Experimental study of vacuum diodes under partial space-charge regime." Diamond and related materials 13.1 (2004): 60-63.

Smith, J. R., R. J. Nemanich, and G. L. Bilbro. "The effect of Schottky barrier lowering and nonplanar emitter geometry on the performance of a thermionic energy converter." Diamond and related materials 15.4 (2006): 870-874.

Smith, Joshua Ryan, Griff L. Bilbro, and Robert J. Nemanich. "Considerations for a high-performance thermionic energy conversion device based on a negative electron affinity emitter." Physical Review B 76.24 (2007): 245327.

* cited by examiner

US 10,790,403 B1

MICROFABRICATED VACUUM PHOTODIODE ARRAYS FOR SOLAR POWER

CROSS REFERENCE TO RELATED APPLICATIONS

The present application is a non-provisional of, and claims benefit of priority from, U.S. Provisional Patent Application No. 61/784,307, filed Mar. 14, 2013, the entirety of which is expressly incorporated herein by reference.

FIELD OF THE INVENTION

The present invention relates to devices for the conversion of optical power to electrical power.

BACKGROUND OF THE INVENTION

Most conventional solar cells of the prior art are based on solid-state photovoltaic devices, which are typically p-n junctions of a crystalline semiconductor such as silicon. In recent years, great strides have been made in increasing the efficiency and decreasing the manufacturing costs of these devices and arrays thereof. However, further improvements in both efficiency and cost are desirable for widespread application of these devices and systems.

A novel alternative approach is based on vacuum photoemission. Here, a photodiode is comprised of a photocathode that absorbs photons and emits electrons into a vacuum space, and an anode that collects the emitted electrons, enabling current flow to an external electrical circuit. This phenomenon is the basis for photomultiplier tubes, which are well known in the prior art as sensitive detectors of optical photons (e.g., Shimoi, U.S. Pat. No. 6,835,922, expressly incorporated by reference in its entirety). A similar approach was proposed early on for solar power conversion (e.g., Geer, U.S. Pat. No. 3,263,101, Williams, U.S. Pat. No. 4,094,703, Edelson, U.S. Pat. No. 5,973,259, expressly incorporated by reference in their entirety), but practical applications for solar power were limited by inefficient operation and expensive custom construction, so that this approach was generally abandoned.

A key limitation to conversion efficiency in vacuum photoemission was previously recognized to be associated with the buildup of space-charge of emitted electrons in the vacuum space between the electrodes (see, e.g., Levy, U.S. Pat. No. 8,143,566, expressly incorporated herein by reference). Specifically, Child's Law (also known as the Child-Langmuir Law) gives the maximum space-charge-limited current density J in a planar photodiode as a function of the gap length d and potential difference $V_d$ between anode and cathode: $J=K\ V_d^{3/2}/d^2$, where $K\sim2.33\ \mu A\cdot V^{-3/2}$. If we take a relatively small $d\sim100\ \mu m$ and $V_d\sim1V$, then $J\sim200\ A/m^2$, which is too small for practical solar cells. A much smaller gap is needed, but would require precision microfabrication techniques. Similar microfabrication techniques have recently been demonstrated, for example using microlithographic techniques for the manufacturing of microelectromechanical systems (MEMS) (e.g., King, U.S. Pat. No. 6,509,669, Walitzki, U.S. Pat. No. 7,589,348, Seppala, U.S. Pat. No. 7,736,946, expressly incorporated herein by reference in their entirety) and flat-panel displays (see, e.g., Kumar, U.S. Pat. No. 5,601,966, Eccleston, U.S. Pat. No. 6,853,127, expressly incorporated herein by reference in their entirety).

Another alternative approach in the prior art is based on concentrated solar illumination to obtain very high temperatures, and then using solar cells that are designed to take advantage of these very high temperatures. Such a system requires an optical tracking system and mirrors to follow the sun (e.g., US 2011/0303214, expressly incorporated by reference in its entirety), but also correspondingly fewer solar cells. One type of high-temperature solar cell is based on thermionic emission from a hot cathode in vacuum (see Fitzpatrick, U.S. Pat. No. 5,028,835, expressly incorporated herein by reference in its entirety). Very recently, a variant of a thermionic emission cell has been proposed, in which the thermionic emission current may be enhanced by direct photoemission (see Schwede, US 2010/0139771, expressly incorporated herein by reference in its entirety). But this still requires very high temperatures and a solar concentrator system for proper operation.

See, 20120060882; 20120146455; 20120299438; 20110226299; 20110221328; 20110148248; 20110139205; 20110100430; 20110084591; 20110023941; 20110017253; 20100139771; 20100090581; 20100072461; 20100055885; 20100028235; 20100026160; 20100018843; 20090322221; 20090315444; 20090284124; 20090256135; 20090229648; 20090223548; 20090205695; 20090170394; 20090167138; 20090158750; 20090139244; 20090130016; 20090127549; 20090107535; 20090101136; 20090098671; 20090079297; 20090078872; 20080203885; 20080197747; 20080174225; 20070024180; 20070024154; 20070006583; 20060138896; 20060137737; 20060124958; 20070166916; 20070126312; 20060138896; 20060137737; 20050275330; 20040189141; 20030192582; 20030184188, each of which is expressly incorporated herein by reference in their entirety.

In any solid metal, the conduction band electrons have velocities which follow a statistical distribution, and occasionally an electron will have enough velocity to exit the metal without being pulled back in. The minimum amount of energy needed for an electron to leave a surface is called the work function. The work function is characteristic of the material and for most metals is on the order of several electron volts. Thermionic currents can be increased by decreasing the work function or increasing the temperature. This often-desired goal can be achieved by applying various oxide coatings to the wire.

The Richardson emission law has the mathematical form:

$$J = A_G T^2 e^{\frac{-w}{kT}}$$

where J is the emission current density,
T is the temperature of the metal,
W is the work function of the metal,
k is the Boltzmann constant, and $$A_G = \lambda_B (1-r_{av}) A_0.$$

where $A_0$ is a universal constant given by $$A_0 = \frac{4\pi m k^2 e}{h^3} = 1.20173 \times 10^6 Am^{-2} K^{-2}$$

where m and $-e$ are the mass and charge of an electron, and h is Planck's constant.

$r_{av}$ is a proportion of the outgoing electrons are reflected as they reached the emitter surface, so the emission current density would be reduced, and $\lambda_B$ would have the value $(1-r_{av})$. Thus, the thermionic emission equation may be rewritten in the form $$J = (1 - r_{av})A_0 T^2 e^{\frac{-w}{kT}}.$$

In electron emission devices, the thermionic electron emitter will be biased negative relative to its surroundings. This creates an electric field of magnitude F at the emitter surface. Without the field, the surface barrier seen by an escaping Fermi-level electron has height W equal to the local work-function. The electric field lowers the surface barrier by an amount ΔW, and increases the emission current. This gives:

$$J(F, T, W) = A_G T^2 e^{\frac{-(W-\Delta w)}{kT}}$$

$$\Delta W = \sqrt{\frac{e^3 F}{4\pi\varepsilon_0}}$$

where $\varepsilon_0$ is the electrical permittivity constant. This is accurate for electric field strengths less than $10^8$ V m$^{-1}$.

Thermionic emission can also be enhanced by interaction with other forms of excitation such as light. Photon-enhanced thermionic emission harnesses both the light and heat of the sun to generate electricity and increases the efficiency of solar power production.

See (Each of which is expressly incorporated herein by reference):
www.physics.csbsju.edu/lab/thermionic.pdf
Richardson, O. W. (2003). Thermionic Emission from Hot Bodies. Wexford College Press. pp. 196. ISBN 978-1-929148-10-3.
books.google.com/books?id=PrbOIoMnxnwC&pg=PA196.
Josephson, M. (1959). Edison. McGraw-Hill. ISBN 0-07-033046-8.
Crowell, C. R. (1965). "The Richardson constant for thermionic emission in Schottky barrier diodes". Solid-State Electronics 8 (4): 395-399. Bibcode 1965SSEle . . . 8..395C. doi:10.1016/0038-1101(65)90116-4.
Kiziroglou, M. E.; Li, X.; Zhukov, A. A.; De Groot, P. A. J.; De Groot, C. H. (2008). "Thermionic field emission at electrodeposited Ni—Si Schottky barriers". Solid-State Electronics 52 (7): 1032-1038. Bibcode 2008SSEle..52.1032K. doi:10.1016/j.sse.2008.03.002.
Orloff, J. (2008). "Schottky emission". Handbook of Charged Particle Optics (2nd ed.). CRC Press. pp. 5-6. ISBN 978-1-4200-4554-3.
books.google.it/
books?id=y0FF19lud5YC&pg=PA6&lpg=PA6&dq=#v=onepage&q=&f=false.
Murphy, E. L.; Good, G. H. (1956). "Thermionic Emission, Field Emission, and the Transition Region". Physical Review 102 (6): 1464-1473. Bibcode 1956PhRv..102.1464M. doi:10.1103/PhysRev.102.1464.
Mal'Shukov, A. G.; Chao, K. A. (2001). "Opto-Thermionic Refrigeration in Semiconductor Heterostructures". Physical Review Letters 86 (24): 5570-5573. Bibcode 2001PhRvL.86.5570M. doi:10.1103/PhysRevLett.86.5570.
Svensson, R.; Holmlid, L. (1992). "Very low work function surfaces from condensed excited states: Rydberg matter of cesium". Surface Science 269/270: 695-699. Bibcode 19925ur5c.269..6955. doi:10.1016/0039-6028(92)91335-9.
Bergeron, L. (2 Aug. 2010). "New solar energy conversion process discovered by Stanford engineers could revamp solar power production". Stanford Report. news.stanford.edu/news/2010/august/new-solar-method-080210.html. Retrieved 2010-08-04.
Schwede, J. W.; et al. (2010). "Photon-enhanced thermionic emission for solar concentrator systems". Nature Materials 9 (9): 762. Bibcode 2010NatMa . . . 9..7625. doi:10.1038/nmat2814.
Green, M. A.; Emery, K.; Hishikawa, Y.; Warta, W. (2011). "Solar cell efficiency tables (version 37)". Progress in Photovoltaics: Research and Applications 19 (1): 84. doi:10.1002/pip.1088.
Myung Gyu Kang; Henri J. Lezec; Fred Sharifi, "Stable Field Emission from Nanoporous Silicon Carbide", Nanotechnology 24:6 (Feb. 15, 2013)

SUMMARY OF THE INVENTION

The present technology provides devices and methods for the conversion of optical power, e.g., over a range of 300-1100 nm wavelengths, to electrical power. More specifically, the optical power is from solar sources, and the devices may be provided in arrays of solar cells.

Advantageously, the present technology provides a design and method for fabrication of arrays of micro-scale vacuum photodiodes that are optimized for high efficiency and low manufacturing cost, and which do not depend on very high temperatures for operation.

A vacuum photodiode according to the present technology comprises a planar vacuum photocathode—a low work-function thin film (such as antimony activated with alkali metals)—separated from a conducting planar anode by a vacuum gap—essentially a parallel-plate capacitor geometry, as shown in FIG. 1. In steady state, after exposure to light, when a photoelectron leaves the photocathode, it performs work on the back potential of the electron cloud (the "space-charge") filling the vacuum and the anode work function, and an electron on the other side then enters the anode at ~zero kinetic energy (to maintain the charge in the space). When the anode and cathode are connected through a load, external electric power is thus generated, corresponding to the energy added by the photon absorption.

The photocathode should generally be very thin, so that the photoelectrons may escape efficiently into the vacuum gap without losing energy. However, such a very thin cathode may not fully absorb the light. For this reason, a reflective layer is also preferably included behind the cathode layer, so that the light may pass through the cathode (at least) twice, thus increasing the absorption probability and the cell energy efficiency.

An important crucial issue in operation, is the current density limit (Child's Law) associated with the space charge, which scales as $J \propto V_d^{1.5} d^{-2}$, where V is the photoelectron voltage leaving the cathode, and d is the gap size. For working voltages at a load of 0.5-1.6 V, and assuming an (unconcentrated) solar energy flux of $P=JV_d\sim1000$ W/m$^2$, J must be >200 A/m$^2$, and the vacuum gap d must be <20 μm. This small vacuum gap dimension is a significant insight and explains why vacuum photocathode technology has not been used heretofore for high power photovoltaics: a 1 mm gap compared to a 10 μm gap would have 10,000 times less maximum current flow.

Furthermore, it is generally believed that the presence of a space charge (i.e., free electrons in the space between cathode and anode) can only degrade the performance of a photodiode, by reducing photoemission from the photocathode due to the repelling electrostatic force. On the contrary, a key part of the present invention is the recognition that a modest amount of space charge can enhance the performance, by converting the excess kinetic energy of photoelectrons to useful photocurrent without substantial reduction in photoemission.

A preferred embodiment of a solar cell according to the present invention is shown in cross-section in FIG. 2. Here, each cell has a vacuum gap of about 10 to 20 µm, and is about 200-400 µm across and about 200 µm thick. A top plate, formed as a vacuum barrier over a transparent anode layer, is formed of transparent glass, about 50-100 µm thick, with a supportive glass ring ~20-40 µm wide that seals the vacuum from the atmosphere and adjacent cells, thus providing resilience of the system comprising many cells against a defect or loss of vacuum in one cell. The bottom surface of the glass is coated with a transparent conducting anode less than 50 nm thick (such as oxide of silver and cesium). The bottom substrate (which may also be as little as about 100 µm thick, or more if it acts as a structural support) is coated with a reflecting layer. The substrate or the reflecting layer may be patterned (using etching, e.g., photolithography, direct write laser, or micromachining techniques) into a "rugose" (i.e., wrinkled or rough) surface, so that the optical reflection overall may be diffuse rather than specular. (Examples of this patterning are described in more detail below.) The surface may have a random pattern or a pattern defined by an algorithm or computer model. The reflecting layer, in turn, is coated with the thin photocathode (5-15 nm thick), comprising, for example, a compound of alkali metals (cesium, sodium, and potassium) and antimony with a low work function (the energy needed to excite an electron into the vacuum). FIG. 3 illustrates how a patterned photocathode may increase the cell quantum efficiency.

A vacuum photodiode may also exhibit a high external power efficiency, conservatively exceeding 35%. This improvement relative to conventional solar cells comes about in several ways:

Mirrored/textured photocathode deposition surface. A mirrored substrate allows two photocathode passes for light, enabling:
(1) very thin photocathode (~5-6 nm) with efficient photoelectron escape, and
(2) incident light dispersed/diffused at large paths through the film in the red/IR, which are less easily absorbed, but where the QE remains high for absorbed photons.

Together these increase the average visible quantum efficiency over typical photocathodes by nearly a factor of four up to 80%, and extend the spectral range into the near IR, about 0.9-1 µm.

Stoichiometrically precise compositions of alkali and Sb thin films, enabled by atomic-layer deposition (ALD) and molecular-beam epitaxy (MBE) processes, create semi-crystal films. These have shown increases of factors of two or more over normal diffusively fabricated cathodes, and may exhibit negative electron affinity.

Thermally generated photocurrents—i.e., thermionic emission from the low work-function photocathode—supply both IR power capture and fill the gap with a gas of electrons. The increase in capturable solar power is estimated to be between 1.7-1.9 times more than that from visible light alone. (See FIG. 4 for a plot showing the wavelength-dependence of the available solar power.) This thermal power is usually considered a "noise power" in detectors such as photo-multiplier tubes. In contrast, in conventional semiconductor photovoltaics, higher temperatures decrease power efficiency, as extra carriers are created on both sides of the junction.

Higher device voltage. The unloaded cell voltage is estimated to be up to ~1.6V, higher than conventional commercial photovoltaics.

Arrays of these devices are also expected to be cost-effective, resulting from the materials and construction technologies:

Materials costs for the thin films on the cathode and anode are about $9-11/m² (estimated in 2013) based on films only ~5-6 nm thick, as compared to ~$500-700/m² for (much thicker) high-efficiency silicon solar cells.

Cells are arranged in a honeycomb structure to form a solar panel; any one closed cell is <1 mm in diameter. Hence, if one vacuum cell fails, a panel is barely affected. Furthermore, a thin glass top surface is only about 50 µm thick, since the span to hold off 1 Atm pressure is about 100 µm wide. The planar structures have raised features of ~1-30 µm, well suited to indenting and other low cost fabrication techniques.

Robotic tooling as used for flat panel displays may be directly applicable to vacuum solar panels, which are far less complex than a display. It is noted that the present technology may also be used to fabricate photodetectors and/or imagers. Since sensitivity extends to the Infrared range, and cells about 0.1 mm, a high efficiency imager may be defined. If the electrodes of various cells are formed, e.g., with materials having different work functions or different filters, a hyperspectral infrared imager may be provided.

High efficiency enables power generation in smaller areas, such as roof and mobile systems, with reduced installation costs.

FIG. 5 provides an illustration of how arrays of photodiode cells may be fabricated, wired, and assembled into large-area structures.

These examples are to be understood as preferred embodiments, but do not limit the various possible implementations of the invention.

It is therefore an object to provide a photodiode cell comprising: a vacuum-sealed enclosure having a window configured to admit external photons into the enclosure; a photocathode inside the enclosure, comprising a thin layer configured to absorb photons and to emit electrons into the enclosure, having an optically reflective layer, configured to reflect photons which pass through the photocathode back toward the photocathode; an anode inside the enclosure, comprising a thin layer configured to collect electrons from inside the enclosure, being electrically isolated from the photocathode and separated by a narrow vacuum gap between the photocathode and the anode; wherein illumination of the photocathode results in emission of electrons comprising a space charge and the space charge enhances an efficiency of energy conversion from the photons to electrical energy.

The vacuum gap between the photocathode and the anode is preferably not more than 20 µm.

The photocathode may be semi-transparent to at least a portion of the external photons.

The optically reflective layer may be electrically conducting, and in direct electrical contact with the photocathode. The optically reflective layer is preferably rough on a scale of about 450 nm to 2000 nm. The optically reflective layer may comprise a thin film deposited on a rough surface of substrate. The rough surface of the substrate may be formed by micromachining.

The vacuum-sealed enclosure may comprise a window that is substantially transparent to optical energy in a range of 450 nm to 1000 nm. The window may be formed of glass.

The anode may be substantially transparent to optical energy in a range of 450 nm to 750 nm.

An efficiency of a conversion of solar insolation to electrical energy by the photocathode and anode is preferably increased by a flux of infrared photons or higher temperature.

The photocathode may comprise an alloy of antimony and cesium.

The enclosure for a respective vacuum sealed enclosure may have a maximum transverse dimension of about 2 mm defining an isolated vacuum-sealed space. The vacuum-sealed enclosure may be hermetically-sealed. The vacuum-sealed enclosure may be subdivided into an array of isolated independent vacuum spaces. The array of isolated independent vacuum spaces may be arranged as a hexagonal tiled array. The array may be provided such that a vacuum failure of a single isolated independent vacuum space does not impair functionality of an adjacent isolated independent vacuum space.

Another object provides a photodiode array, comprising: an array of vacuum spaces, each having a window transparent to optical and infrared photons; an inner surface of the window of each space being coated with a transparent anode layer, configured to collect electrons from a respective vacuum space; a photocathode formed on a roughened reflective surface opposed to the window, spaced from the anode by a gap of less than about 20 μm, wherein illumination of the photocathode results in emission of electrons comprising a space charge in the vacuum space which enhances a photoelectric conversion efficiency. The array may be constructed such that vacuum failure of a single vacuum space does not impair functionality of another vacuum space.

A further object provides a method of manufacturing a solar photovoltaic panel, comprising: micropatterning a surface of a support to provide micron scale roughness; depositing a reflection layer on the micropatterned surface; depositing a photocathode layer on the reflection layer; providing a micromachined window partitioned into a regular array of separated cells, having an inner surface coated with a transparent conducting anode layer; and sealing the micromachined window to the support to define an array of vacuum spaces.

The micromachined window may have an antireflective coating on at least one surface, and/or a gas diffusion barrier layer coating on at least one surface.

An array of conductive elements may be configured to form an electrical circuit for conducting current between the photocathode and the anode layer.

These and other objects will become apparent from a review of the description of the various embodiments, in respective combinations, permutations, and subcombinations.

DETAILED DESCRIPTION OF THE INVENTION

Figure 6:
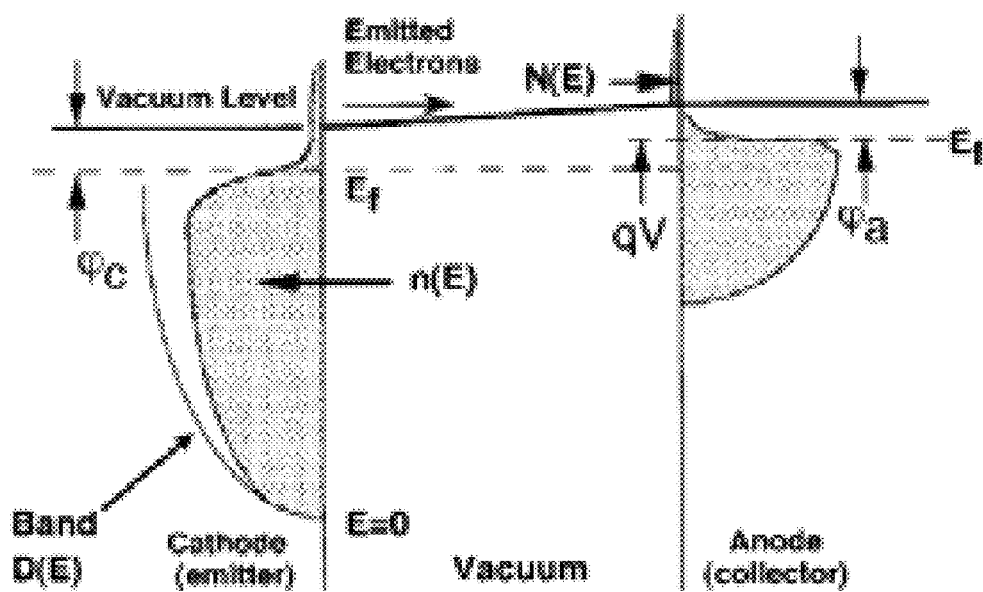
FIG. 6 shows the Energy Diagram for Photovoltaic Operation of a Photodiode Cell.

From the perspective of electron energies in the electrodes, the vacuum photovoltaic diode works as shown in FIG. 6. The cathode and anode have work functions $\varphi_e$ and $\varphi_a$ respectively. A steady state/equilibrium current I that flows through the load resistor $R_L$ causes the anode Fermi level to be raised by $qV=e(V=IR_L)$ above the photocathode Fermi level $E_F$, where n(E) is the electron density of states as a function of energy. A photon of energy $E=hf=hc/\lambda$ is absorbed by the photocathode, which emits an electron of energy $\frac{1}{2} mv^2$, traversing the cathode-anode spacing, expending an energy $\varphi_a+\frac{1}{2} mv^2$, and then proceeds through the external circuit/load $R_L$. The energy available to the load is therefore $eIR_L=hf-\varphi_a-\frac{1}{2} mv^2$, whereby the latter two terms represent the energy loss heating the anode, and in effect the result of an effective internal resistance to the cell. The photocathode work function $\varphi_e$ does not affect the conversion process directly, but is essential to be smaller than the photon energy of solar spectrum as far as possible. Further, the anode work function $\varphi_a$ is essential to be as small as possible. A low and convenient anode work function is evidently that of Ag—Cs(O) which has been measured to be as low as 0.4 eV, even lower effective work function materials may be available. One other low work function material, also conductive, is nitrogen-doped semi-conducting diamond films deposited by CVD (chemical vapor deposition) Also, the anode should have very low photoelectron quantum efficiency (QE) so that there is minimal back photocurrent. A very thin highly transparent Ag—Cs:O layer would have a peak QE of less than 0.5%. Other metals like Bi could be used with a lower cell voltage.

It is important to note that the vacuum diode operates in and saturates the space-charge limited flow (Child's Law) regime—the current density in vacuum varies inversely as the square of the cathode-anode distance $d^{-2}$, and directly with diode voltage $V^{1.5}$. Since the photovoltaic diode operates at voltages of order ~1 volt, large current densities are necessary for efficient large IV solar power, and the cathode-anode distance must be far smaller than used in vacuum photocathode detectors (photomultipliers, image intensifiers), which operate at kV and <μA ranges.

Also it is important that the kinetic energy of the electrons is converted into electron current flow and not heat on the anode—that is, the electron emitted from the photocathode works against the fields in the electron-filled vacuum gap, so as to arrive at the anode with an average kinetic energy near zero. This has important implications for the design and efficiency of the photodiode, discussed below.

Figure 4:
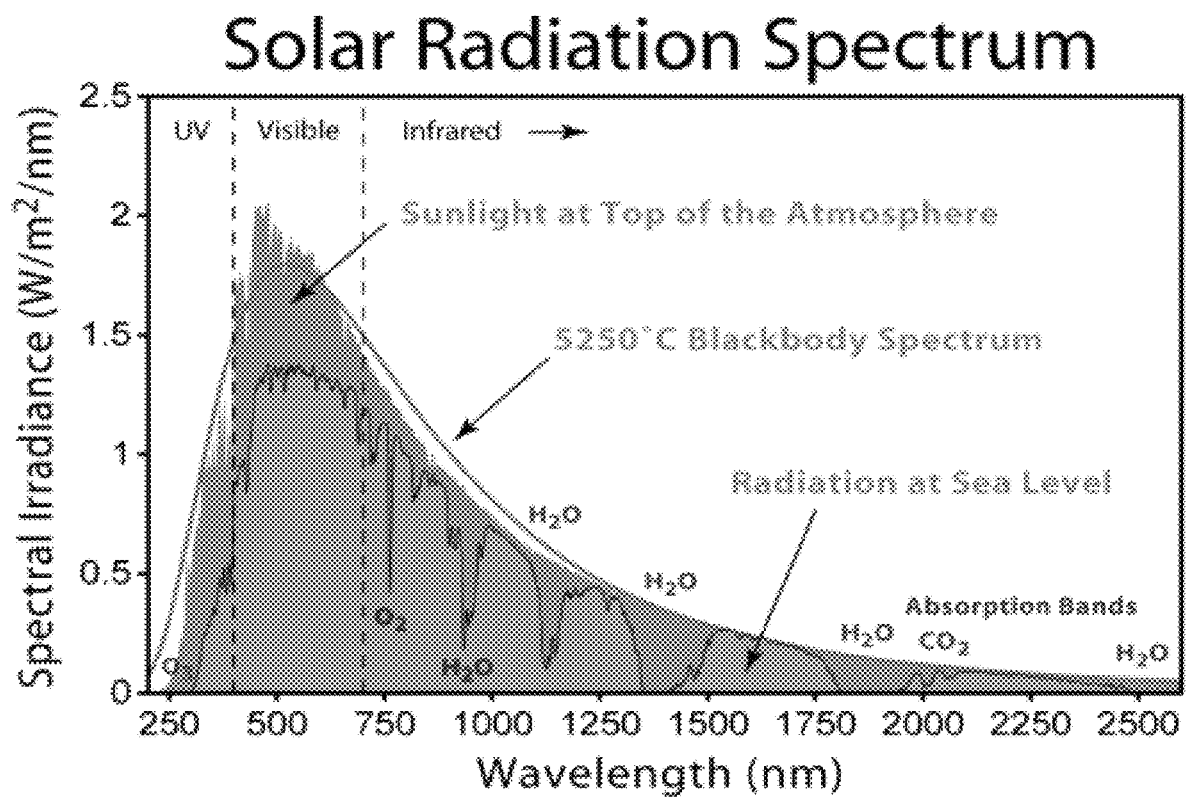
FIG. 4 presents a plot showing the wavelength-dependence of the available solar power.

FIG. 4 shows the ASTM solar power spectrum—note the power above visible wavelengths. About 40-50% of the power in the solar spectrum (ASTM G159) has an energy above ~1.7 eV (~650 nm) (FIG. 4), with the peak and average power for that spectrum about 3 eV, appropriate for a bialkali ($K_2CsSb$) or other multialkali photocathodes. A solar cell with both photoemission and thermionic emission captures nearly two time more energy than a photovoltaic cell alone, extending the accessible optical power from about 700 nm out to about 1500 nm. A vacuum photocathode can do this, but a single semiconductor alone cannot.

Using a multialkali photocathode, the limit is 1.6 eV and about 70%-80% of the solar spectrum. However, the addition of thermionic emission nearly doubles that power. Using the relationships above, the cell voltage can thus be expected to be at minimum 1.6 V—0.4 V=1.2 V, and at maximum about 2.6 V (short wavelengths), for operation into a matched load. (Like any photovoltaic, the vacuum photodiode is a constant current source at any fixed illumination, and power efficiency is maximized with a matched resistive load line—also see below.) If the anode work function in a practical solar cell is closer to, say 0.6 eV, then the cell voltages can be expected to be at least ~1V or more.

The conversion process in a vacuum photocathode relies on three steps:

a) Absorption of a photon in the cathode, which is dependent on wavelength (via the optical reflectivity R(f) and the skin depth δ(f)), followed by photo-excitation of an electron.

b) Transport of the photo-excited electron to the vacuum-cathode interface surface, subject to scattering by impurities/defects, e-e and e-phonon scattering. This process depends on electron energy and distribution, and the various scattering rates (relaxation times).

c) Emission probability D(E). For a metal this depends on the chemical potential μ and work function φ. For a semiconductor like Alkali-CsSb this depends on the barrier height electron affinity $E_a$ measured from conduction band minimum, and $E_g$ the band gap energy.

Note that the absorption of light and transport of the electron to the surface compete with each other: the thicker the cathode layer, the more light is absorbed, but it is harder for the electrons to reach the surface. Thus the maximum quantum efficiency is a compromise between absorption and transport/emission. Remarkably, the quantum efficiency of modern bi- and tri-alkali cesiated-Sb ($NaCs_2Sb$, $K_2CsSb$, NaKCsSb) based vacuum photocathodes in transmission mode has reached a level four times that of a $Cs_3Sb$ S-11 photocathode first used 50 years ago, peaking at about 55% in the blue-green, and without the use of a reflector as provided herein.

The basic technologies for achieving improvements in photocathode quantum efficiency and radiant sensitivity are:
 a) highly purified materials, e.g., better than 99.9999%,
 b) optimal tuning of the photocathode thickness,
 c) co-deposition of the materials rather than diffusion for uniformity and band-bending and to avoid growth defects, such as alkali islands;
 d) optimal tuning of the stoichiometric ratios of the material,
 e) optimal tuning of photocathode optical coupling, such as the inclusion of an antireflective layer and a diffuser layer, for example of a milky scattering layer of paraloid, f) optimal tuning of the Sb layer thickness.

Together, these may result in an improved quantum efficiency (QE) even without a mirrored or patterned surface as shown below.

However, these power efficiencies can be dramatically improved further. Optical absorption by the photocathode continues to be an issue that limits performance. If the absorption were able to be increased for the same or lesser thickness of photocathode, the quantum efficiency would increase proportionally. For a conventional S20 photocathode at 400 nm, a typical 30 nm thick photocathode absorbs only about 40% of the light, but less than 1% by 900 nm. Moreover, the photoelectron scattering length is about 25 nm. Classical Quantum Efficiency (QE) values of about 20% at blue and <<1% in near IR are the result of this modest to poor absorption, and 50% of the electrons heading the wrong way. Just by increasing absorption to 100% there are potential gains in QE from about 2.5 times at 400 nm to about 100 times at 900 nm. Further gains may be available with better cathode processing.

As one preferred embodiment of the invention, a major improvement via absorption can be obtained by depositing a thinner semitransparent photocathode on a mirror surface. This is because the optimal thickness of the photocathode to balance absorption with photoelectron escape produces a photocathode with only a small optical absorption. This simple specular mirrored photocathode substrate and thinner photocathodes technique allows radiant sensitivities of greater than 180 mA of output current per Watt of incident radiation for a significant portion of the solar spectrum, when used with photocathodes with modern improvements, and tuned to a thinner thickness to allow more photoelectron escape while having two passes.

Also, with a carefully engineered micropatterned diffuse reflector rather than a specular mirror, even longer absorption paths are possible by factors on average of at least 1.4 (nearly two is theoretically possible, given the solar solid angle), which has a dramatic effect at the longer wavelengths. For semitransparent photocathodes in transmission mode, recent work on photocathodes for detectors has indeed demonstrated remarkable enhancement with the technique of using two or more optical passes at grazing angles for light on thinned semitransparent photocathodes to enhance absorption.

We can thus anticipate radiant sensitivities for an engineered mirrored substrate semitransparent multialkali photocathode used in reflection mode to exceed 240 mA per W for nearly 80% of the solar spectrum. With an open circuit cell voltage of 1.4 V, which corresponds to a power efficiency at least 26%, and likely much more, if the lower sensitivity components of infrared radiation and the potential for an open circuit cell voltage of 2.5 V are included in the estimate. This is competitive with lower cost solar cells (thin films, amorphous, polycrystalline). An upper limit is estimated at 31%, not counting other improvements in anode work function or the QE spectrum of the photocathode, which would then approach or exceed that of the best practical silicon cells.

Figure 3A:
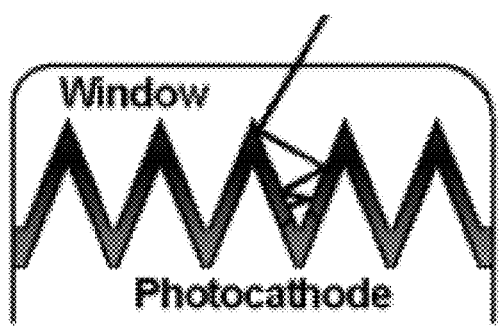
FIGS. 3A, 3B and 3C illustrate how a patterned photocathode may increase the cell quantum efficiency, showing a schematic ray tracing for a deep recess photocathode, photomicrographs of a textured photocathode surface, and quantum efficiency vs. wavelength for normal and prism designs, respectively.
Figure 3B:
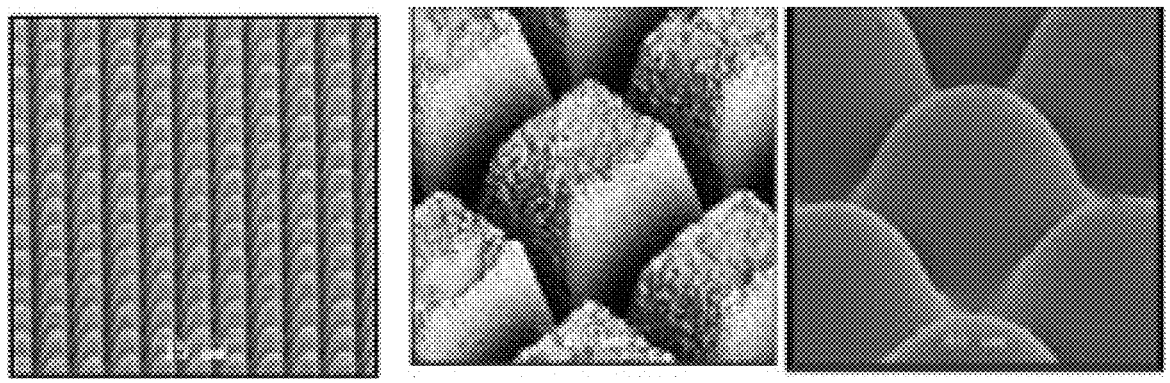
Figure 3C:
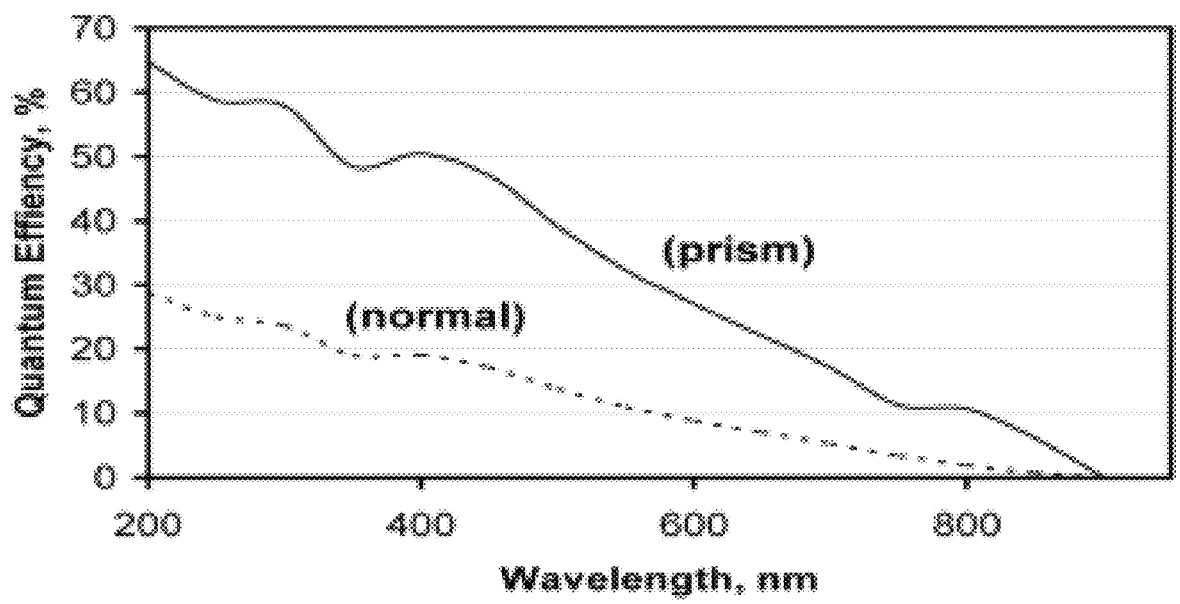

FIGS. 3A, 3B and 3C show photomicrographs of a textured surface, enabling multipath absorption. By increasing the absorption, one can also thin the photocathode, facilitating escape of the photoelectrons. This is micromachinable in several configurations. A variety of rugose (wrinkled) multipath absorption configurations for photocathode substrates can be created by micromachining. The enhancement in quantum efficiency by machined prisms used as photocathode substrates is more than doubled for wavelengths >400 nm.

The mirror surface on which the semitransparent cathode is deposited serves as a near-perfect photocathode electrical connection, unlike conductive layers on glass, since the highly resistive photocathode is in intimate contact with a metal current supply. The transparent anode has a direct highly conductive surface. Many new nanoscale film schemes for highly conductive yet very transparent surfaces are now available, using carbon nanotubes or sub-wavelength nanoscale metal meshes.

The potential thermodynamic limit of vacuum photovoltaics greatly exceeds that of single junction Si, an indirect bandgap material, which limits simple Si cells to about 33% efficiency. On the other hand, for the direct-gap cesiated-Sb photocathode, taking the effective operating temperature of ~eV electrons and photons, the corresponding limit is above 90%, far exceeding Si, since the effective temperature of operation is that of the electrons/incident photons on the order of 10,000 K. Indeed, if thermionic emission, utilizing the longer wavelengths for heating the cathode, is taken into account, the cell power efficiency may nearly double.

As discussed above, space charge limited flow is a crucial part of the vacuum photovoltaic technology. In order to function as a vacuum diode, the issue of space charge limited electron flow in vacuum needs to be addressed. Child's Law implies that the space-charge limited flow in a vacuum diode varies inversely as the square of the cathode-anode gap $d^{-2}$, and directly with the voltage as $V^{1.5}$. To reach the power efficiency needed, the anode current needs to significantly exceed about 1000 A/m² if the load drop is about 1V for the solar spectrum at efficiencies above 80%. As more and more electrons fill the space of the diode between the anode and cathode, the electric field eventually is shut off, limiting the current flow, and so the maximum current is inversely proportional to the square of the gap distance. This gives the maximum space-charge-limited current in a planar diode of infinite radius (i.e. one-dimensional beam) as a function of the length and potential difference between anode and cathode is given by: $J=K\ V_d^{3/2}/d^2$, where J=current density (mA mm$^{-2}$), $V_d$=potential difference between anode and cathode (V), d=distance between anode and cathode (mm), K is a constant given by $K=(4/9)\varepsilon_0\ (2e/m)^{1/2}$ where $\varepsilon_0$=permittivity of free-space=$8.85\times10^{-12}\times$Fm$^{-1}$, and e/m=electron charge (C) to mass (kg) ratio=$1.76\times10^{11}$ C kg$^{-1}$. For electrons, $K\sim0.00233$ mA $V^{-3/2}$. In steady state current flow, the current density of space-charge limited flow in a diode (here with no applied voltage other than the work function differences) is thus given by: $J\ (A/m^2)=(a^2\ d^2)^{-1}$ where the spacing between the anode and cathode is d, and the constant a is given by $a^2=4.25\times10^5$ (eV)$^{-1.5}$ per Ampere, where the V is the effective cell voltage and e is the electron charge. If eV~1 eV for a 1V cell voltage, and d=100 µm, then the space charge limited flow exceeds 230 A/m². If the operating voltage drop is 0.5 V, the space charge limit is 350 A/m² at 50 µm gap; a safety margin of a factor of 3 with a 40% power efficiency at 0.5 Volts would require a ~20 µm gap. Spacings of less than 20 µm or less will provide a reasonable contingency.

Along with the heretofore modest QE from vacuum photocathodes, the need for a small gap is a prime reason this simple photovoltaic device has been overlooked, heretofore. Most vacuum photocathode devices, like photomultiplier tubes (PMT), being used as detectors, are designed to work for photocurrents of ~µA max at the highest fluxes, and so the issue of space charge limitations on performance is simply not relevant. All commercially available PMT or image intensifiers have gaps greater than about 1 mm, cathode-anode or dynode separation, especially since they are meant to have a large applied voltage. The gaps limit current flow by factors of about one thousand to about ten thousand lower than needed for solar power, and makes any attempts to measure power efficiency from sources with the sun's brightness marginal, compared to what is possible and necessary for solar power. Prior investigations of vacuum photocathode solar power systems apparently have not recognized this.

Materials costs per unit of efficiency are a limiting issue in photovoltaics. The sufficiently refined raw materials costs to fabricate a cesiated-alkali metal antimony vacuum photocathode are less than $10/m² in 2009 prices, in part because of the small quantities needed to produce films only 15-30 nm thick films of Alkali-metal-Cs—Sb weakly bound semiconductors from codeposited highly refined K, Na, Cs and Sb. The amount of energy needed to manufacture the cells is also an issue. Assuming a solar power efficiency of 15%-22%, the predicted range of power efficiencies using a modern vacuum photocathode diode, the energy costs to fabricate a photocathode-based power system in principle could be obtained with less than one-half year of typical sun exposure, compared with 4-5 years of solar exposure for the energy needed to refine the Si used in the cell. These are significant potential advantages, and yield a price/performance profile with many advantages over silicon solar cells and other technologies. Moreover, advances in vacuum photocathodes presently being advanced using nanocrystalline materials, carbon nanotubes, and other nanotechnologies may further improve vacuum photocathodes.

One concern for vacuum photocathodes might be photocathode and vacuum seal aging. Based on existing data, this is not likely to be a serious concern if the parts are made in clean facilities under controlled conditions, such as conventionally achieved for Very-Large-Scale Integrated Circuits (VLSI), and the operating temperature is kept to <250° C. Heretofore, photomultipliers have operated for >25 years continuously at 2 kV, as have CRT tubes (cathode ray tubes for old-style televisions) at 20 kV. Moreover, since the voltages in this device do not exceed ~1 V, there is negligible ion feedback (the main cause for photocathode aging in photomultipliers) or other destructive energetic particle or electromigration behavior—and far less than for conventional plasma displays, which, except for phosphor aging issues, operate for very long periods. This is also superior to aging in conventional silicon semiconductor solar cells, and especially in multi-element semiconductors such as CIGS (Copper indium gallium selenide) or CdTe, where thermal cycling and electromigration lead to failures.

In one embodiment, an array of cells is manufactured in an assembly as described below. A metal plate (about 3 mm thick stainless overcoated with 200 nm of Ag) comprises the photocathode substrate which also serves as the structural element of a solar panel of typical 1-3 foot square sizes. (It could be mechanically strengthened or supported by an external polymer or other structural surface for flatness and strength if necessary). A conducting anode window, formed of glass about 1-2 mm thick, coated with a conducting transparent film, protected on top by ~0.1 mm of polymer/antireflective coating, is mated to the anode plate. The basic photovoltaic cells that together form a panel have a size of about 5 mm to 25 mm in linear dimension, and form individual vacuum sealed photovoltaic diodes. The anode and cathode in the basic cell are separated by a glass or ceramic vacuum perimeter insulator/spacer, about 10 to 100 microns wide×10 to 50 microns high glass microwalls or microberm laid out in a checkerboard or honeycomb matrix, forming the perimeter of the basic cells, and preserving the vacuum integrity even if a neighboring cell fails.

The wiring is not shown in detail, but a combination of parallel and serial connections may be used, optimized to particular applications. The parallel/serial photolithographic thick-film wiring in the spacers, fabricated with photolithography is optimized depending on the developed cell voltage (e.g., 0.6-1.4 V expected) and current (~500 A/m$^2$). Additional protection diodes, capacitive and/or resistive ballasts, or active load-adjusting circuitry may be added as needed.

Figure 1:
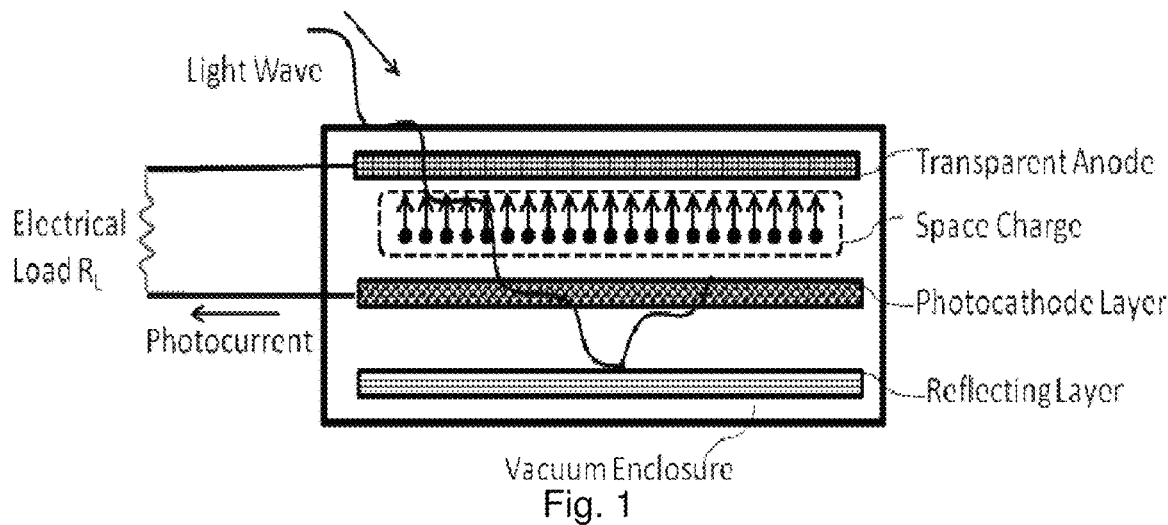
FIG. 1 shows a diagram of a vacuum photodiode cell according to the present technology.
Figure 2:
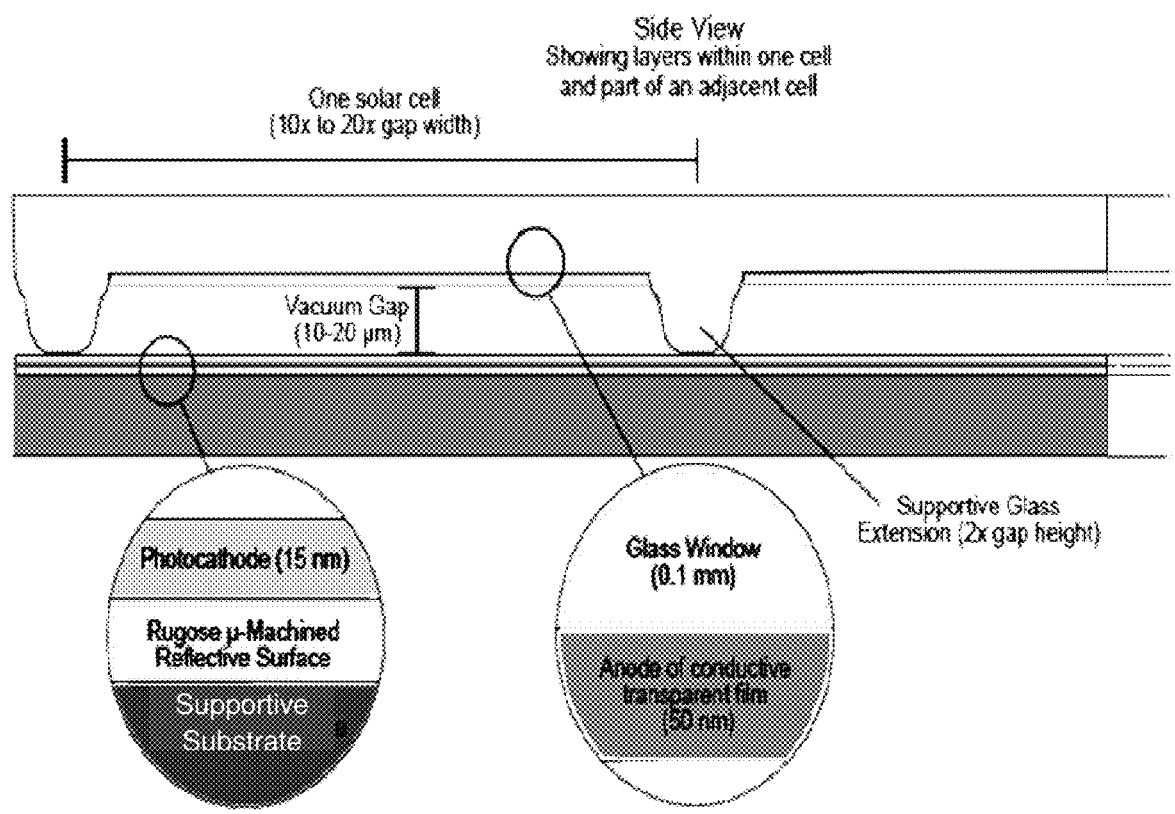
FIG. 2 shows a cross-sectional view of the details of a photodiode cell in an array.

The spacers shown in FIG. 2 form a regular array, like a micro-egg-crate/checkerboard or a honeycomb, with the wall width consuming about 2-5% of the panel area cell, thus supporting the vacuum anode window every approximately 100 microns and allowing very thin glass over panel-sized areas. Each square or hex/honeycomb walled cell forms its own micro-vacuum chamber, isolated from the others, so that a random vacuum failure only removes a tiny fraction of the entire solar panel.

Figure 5A:
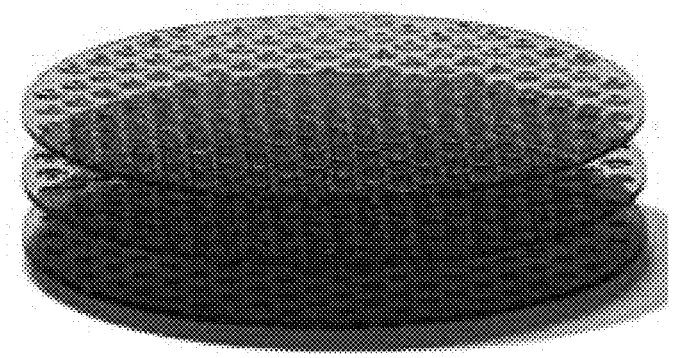
FIGS. 5A, 5B and 5C provide illustrations of how arrays of photodiode cells may be fabricated, wired, and assembled into large-area structures, respectively.
Figure 5B:
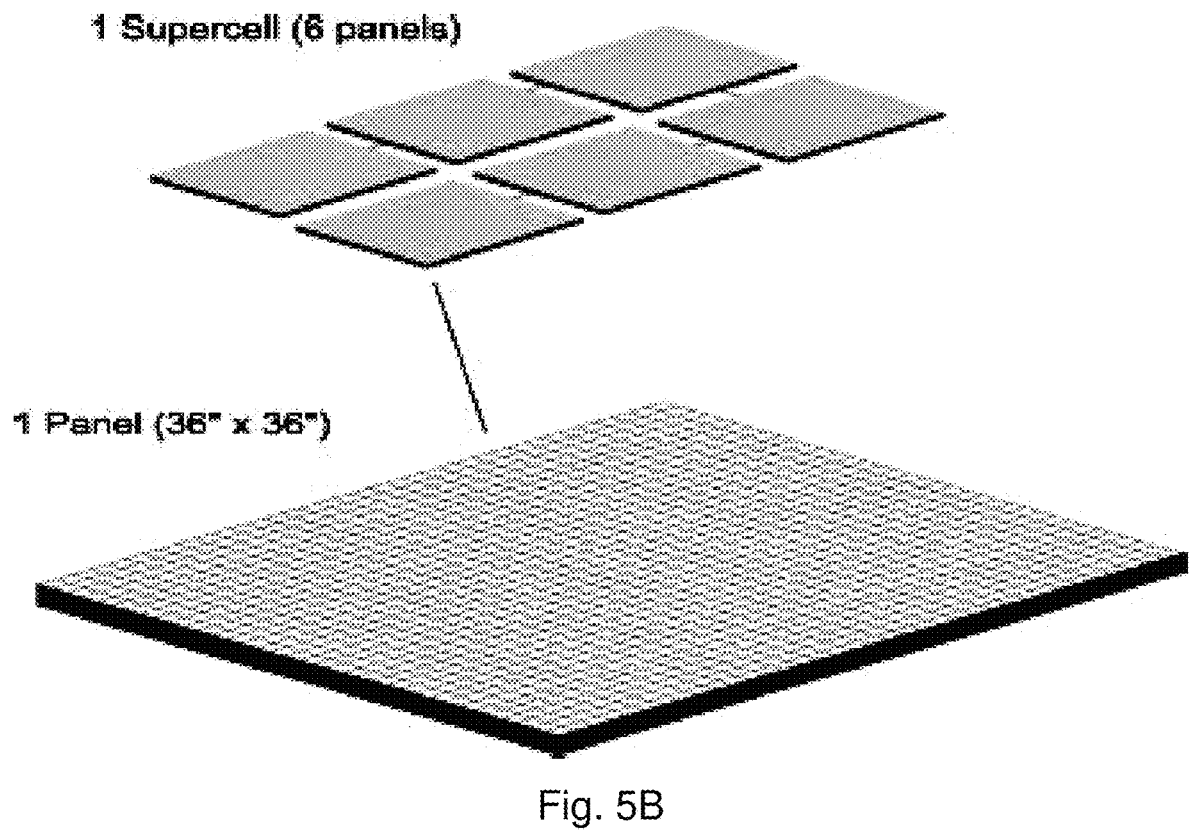
Figure 5C:
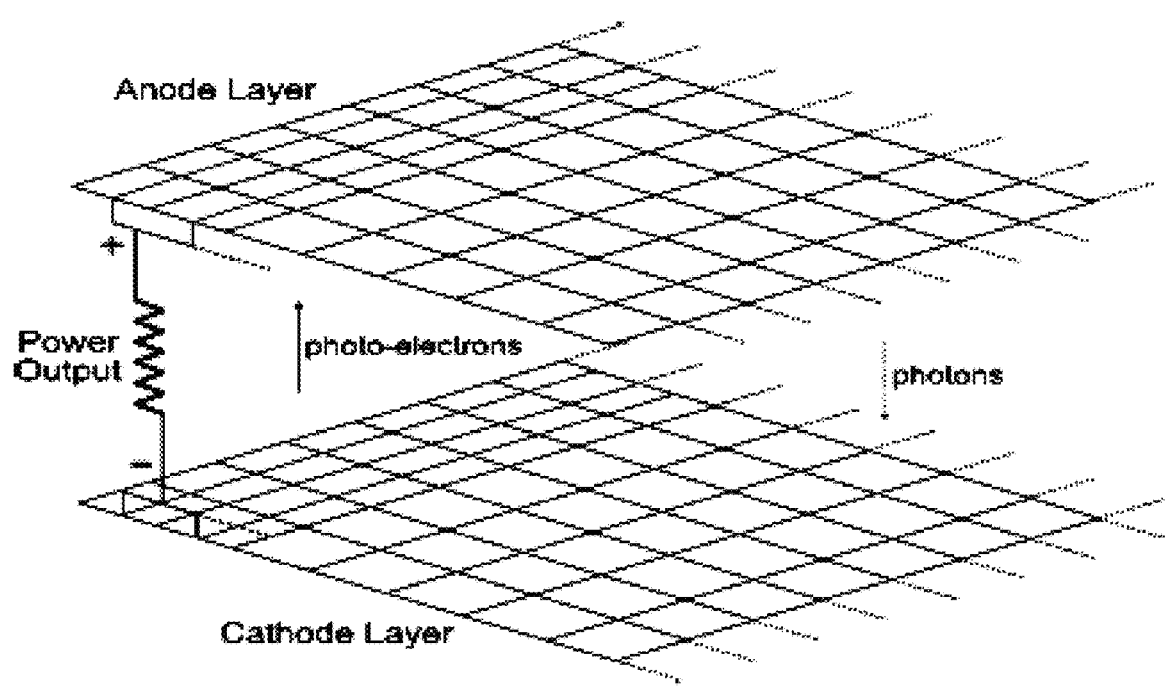

FIGS. 5A, 5B and 5C show views of an embodiment for the basic cells in a panel and wired together. Such a panel would be less than about 4-6 mm thick. This structure is similar to flat-panel low-pressure TV/plasma displays, which have all the elements of this vacuum photodiode array, with the added complication of pixel addressing. The far simpler vacuum photodiode can be manufactured for less than $100/m$^2$, or well less than $1/W. This is consistent with existing at-factory costs of flat panel TVs without packaging, TV electronics, connectors, etc.

Figure 7:
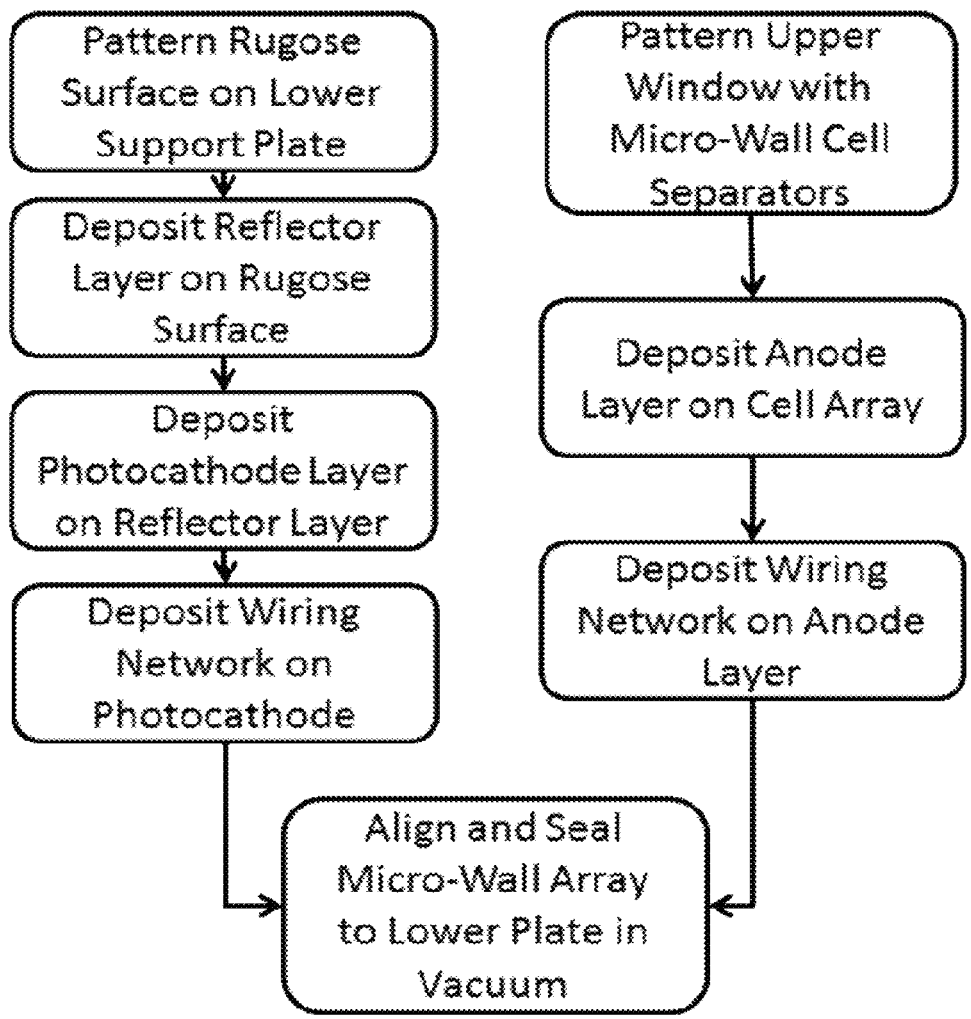
FIG. 7 shows a Flow Chart for the manufacturing of large-area panels with arrays of photodiode cells.

FIG. 7 shows a flow chart for the manufacturing of these solar cell panels, according to a preferred embodiment. The process starts with the processing for the top plate and the bottom plate in parallel. All deposition and patterning steps can be done for the entire array, with each plate preferably transported between a set of appropriate cluster-tool vacuum deposition systems. As a final step, the upper and lower plates can be aligned and sealed together in vacuum, creating an array of cells with isolated hermetically sealed vacua. This approach should be clean, automated, efficient, and cost-effective for large-scale manufacturing.

In summary, a significant transformational solar cell approach, based on a confluence of technologies enabling high-efficiency manufacturable vacuum photodiode arrays, as an alternate to established bulk or compound semiconductor photovoltaics. The embodiments of the system design and manufacturing process are for illustrative purposes only, and do not restrict the scope of the invention.

What is claimed is:

1. A photodiode cell, comprising:
   a vacuum-sealed enclosure having a window configured to admit external photons into the enclosure;
   a photocathode inside the enclosure, comprising a thin layer configured to absorb photons and to emit photoexcited and thermally excited electrons into the enclosure to form a space charge;
   an anode inside the enclosure, comprising a thin layer configured to collect electrons from inside the enclosure, being electrically isolated from the photocathode and separated by a vacuum gap between the photocathode and the anode of not more than 20 μm, wherein the anode has a work function of less than or equal to 0.6 eV;
   wherein illumination of the photocathode at an intensity of 1 kW/m$^2$ sunlight under load results in emission of electrons into the vacuum gap in an amount of at least 200 A/m$^2$ at a photodiode cell voltage of at least 0.5 V comprising the space charge,
   wherein the space charge formation enhances an efficiency of power conversion from the photons to electrical power, substantially without heating the anode due to excess kinetic energy of photoexcited electrons.

2. The photodiode cell according to claim 1, wherein the photocathode is semi-transparent to at least a portion of the external photons, further comprising an optically reflective layer on an opposite side of the photocathode from the anode configured to reflect photons which pass through the semi-transparent photocathode back into the photocathode, wherein the optically reflective layer is electrically conducting, and in direct electrical contact with the photocathode.

3. The photodiode cell according to claim 2, wherein the optically reflective layer is rough on a scale of about 450 nm to 2000 nm and comprises a thin film deposited on a rough surface of a substrate.

4. The photodiode cell according to claim 3, wherein the rough surface of the substrate is micromachined.

5. The photodiode cell according to claim 1, wherein under solar illumination, the space charge is sufficient to sweep electrons emitted from the photocathode to the anode at about zero kinetic energy, the photocathode being electrically isolated from the anode.

6. The photodiode cell according to claim 1, wherein the window is substantially transparent to optical energy in a range of 450 nm to 1000 nm and the anode is substantially transparent to optical energy in a range of 450 nm to 750 nm.

7. The photodiode cell according to claim 6, wherein the window comprises a glass.

8. The photodiode cell according to claim 1, wherein an efficiency of a conversion of solar insolation to electrical energy by the photocathode and anode is increased by a flux of infrared photons.

9. The photodiode cell according to claim 1, wherein an efficiency of a conversion of solar insolation to electrical energy by the photocathode and anode is increased by an increase in temperature.

10. The photodiode cell according to claim 1, wherein the photocathode comprises an alloy of at least antimony and cesium.

11. The photodiode cell according to claim 1, wherein the enclosure has a maximum transverse dimension of about 2 mm defining an isolated vacuum-sealed space.

12. The photodiode cell according to claim 1, wherein the vacuum-sealed enclosure is subdivided into an array of isolated independent vacuum spaces.

13. The photodiode cell according to claim 12, wherein the array of isolated independent vacuum spaces is arranged as a hexagonal tiled array.

14. The photodiode cell according to claim 12, wherein a vacuum failure of a single isolated independent vacuum space does not impair functionality of an adjacent isolated independent vacuum space.

15. A photodiode cell, comprising:
   a vacuum space having a window transparent to optical and infrared photons;
   an inner surface of the window coated with a transparent anode layer having a work function of less than or equal to about 0.6 eV, configured to collect electrons from the vacuum space;
   a photocathode formed on a roughened reflective surface opposed to the window inside of the vacuum space, spaced from the transparent anode layer by a gap of less than about 20 μm, wherein illumination of the photocathode at an intensity of 1 kW/m$^2$ sunlight under load results in emission of photoexcited and thermally excited electrons into the vacuum space in an amount of at least 200 A/m$^2$ at a photodiode cell voltage of at least 0.5 V, to generate a space charge in the vacuum space, the space charge being effective to enhance a photoelectric power conversion efficiency of optical and infrared photons which pass through the window, substantially without heating the transparent anode layer due to excess kinetic energy of photoexcited electrons.

16. The photodiode cell according to claim 15, further comprising a photonically reflective surface beneath the photocathode, configured to reflect at least optical photons which pass through the photocathode back toward the photocathode.

17. The photodiode cell according to claim 15, further comprising a physical barrier to separate the vacuum space into a plurality of independently operable photodiodes.

18. The photodiode cell according to claim 17, wherein a first vacuum space of a first photodiode is isolated from a second vacuum space of a second photodiode adjacent to the first photodiode, and a vacuum failure of the second vacuum space of the second photodiode does not impair functionality of the first photodiode.

19. A photodiode cell comprising:
a window configured to transmit photons;
an optically transmissive anode formed on an inner surface of the window having a work function of less than or equal to 0.6 eV, configured to collect emitted electrons from a vacuum space; and
a photocathode, separated from the anode by a gap in the vacuum space, configured to absorb photons and to emit photoexcited and thermally excited electrons to form a space-charge in front of the photocathode in the vacuum space, sufficient to sweep emitted electrons from the photocathode to the anode at about zero kinetic energy, substantially without heating the anode due to excess kinetic energy of photoexcited electrons, the photocathode being electrically isolated from the anode and spaced from the anode by the gap of less than about 20 μm, wherein illumination of the photocathode at an intensity of 1 kW/m$^2$ sunlight under load results in emission of electrons into the vacuum space in an amount of at least 200 A/m$^2$ at a photodiode cell voltage of at least 0.5 V, comprising the space-charge.

20. The photodiode cell according to claim 19, wherein the photocathode is semi-transparent to at least a portion of the photons, further comprising a reflective layer behind the photocathode, which is rough on a scale of about 450 nm to 2000 nm, configured to scatter photons which pass through the photocathode back into the photocathode.

21. The photodiode cell according to claim 19, wherein the photocathode has a thermionic emission and a photonic emission under solar illumination, wherein the thermionic emission and the photonic emission provide between 1.7 and 1.9 times more total power than the visible light alone.

* * * * *